(12) United States Patent
Uebel et al.

(10) Patent No.: US 9,985,582 B2
(45) Date of Patent: May 29, 2018

(54) THERMAL MANAGEMENT OF SYSTEMS WITH ELECTRIC COMPONENTS

(71) Applicant: SunPower Corporation, San Jose, CA (US)

(72) Inventors: Udo Uebel, San Francisco, CA (US); Gaurang Kavaiya, Concord, CA (US); Kevin Fischer, Orinda, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 447 days.

(21) Appl. No.: 14/810,424

(22) Filed: Jul. 27, 2015

(65) Prior Publication Data

US 2017/0033734 A1 Feb. 2, 2017

(51) Int. Cl.
*H02S 50/00* (2014.01)
*G01K 13/00* (2006.01)
*G01R 21/06* (2006.01)

(52) U.S. Cl.
CPC .............. *H02S 50/00* (2013.01); *G01K 13/00* (2013.01); *G01R 21/06* (2013.01)

(58) Field of Classification Search
CPC .................................. H02S 50/00; H02S 40/34
See application file for complete search history.

(56) References Cited

U.S. PATENT DOCUMENTS

| 8,774,007 | B2 | 7/2014 | Hussain et al. |
| 9,020,653 | B2 | 4/2015 | Lenox |
| 2010/0071744 | A1 | 3/2010 | Peurach et al. |
| 2011/0036344 | A1* | 2/2011 | Jain .......................... H02S 50/10 126/575 |
| 2011/0041888 | A1* | 2/2011 | Levine ..................... E04D 3/352 136/244 |
| 2011/0084551 | A1 | 4/2011 | Johnson et al. |
| 2013/0049710 | A1 | 2/2013 | Kraft et al. |
| 2013/0166093 | A1* | 6/2013 | Kim ......................... G06F 1/206 700/299 |
| 2013/0190939 | A1 | 7/2013 | Lenox |

FOREIGN PATENT DOCUMENTS

| EP | 1 914 778 A2 | 4/2008 |
| JP | 2004-297174 A | 10/2004 |
| JP | 2013-214640 A | 10/2013 |

OTHER PUBLICATIONS

Notification of Transmittal of the International Search Report and the Written Opinion of the International Searching Authority, or the Declaration for International Application No. PCT/US2016/042079 (dated Oct. 20, 2016).

* cited by examiner

*Primary Examiner* — Jeffrey Shin
(74) *Attorney, Agent, or Firm* — Jenkins, Wilson, Taylor & Hunt, P.A.

(57) ABSTRACT

Methods, systems, and computer readable media are disclosed for thermal management of a system of one or more electric components. In some examples, the system includes a housing, one or more electric components, one or more temperature sensors on or in the housing, and a thermal management circuit coupled to the electric components and the temperature sensors. The thermal management circuit is configured to monitor the temperature sensors and, based on monitoring the temperature sensors, cause at least a first electric component to curtail power consumption, thereby reducing heat generating by the first electric component.

18 Claims, 5 Drawing Sheets

THERMAL MANAGEMENT OF SYSTEMS WITH ELECTRIC COMPONENTS

BACKGROUND

The subject matter described in this specification relates generally to thermal management of systems with electric components, for example, photovoltaic supervisor systems.

Photovoltaic cells, commonly known as solar cells, are devices for conversion of solar radiation into electric energy. A solar panel system typically includes a panel of multiple photovoltaic cells on a frame, one or more inverters, and interconnection wiring. A solar panel system can also include other optional components such as batteries, solar trackers, and a meteorological station. The frame can be mounted on top of a building and the other components can be located on the outside or inside of the building to interface with an electric grid of the building and, in some cases, a utility electric grid. Some solar panel systems include a photovoltaic supervisor that includes a central processing unit for, e.g., interfacing with net and sub meters, inverters, and other optional components.

SUMMARY

A system of one or more electric components and one or more temperature sensors includes a thermal management circuit for curtailing power consumption of the electric components based on monitoring the temperature sensors. In some examples, the system includes a housing, one or more electric components, one or more temperature sensors on or in the housing, and a thermal management circuit coupled to the electric components and the temperature sensors. The thermal management circuit is configured to monitor the temperature sensors and, based on monitoring the temperature sensors, cause at least a first electric component to curtail power consumption, thereby reducing heat dissipated by the first electric component. The system can be useful, e.g., in a photovoltaic supervisor system for a solar panel system, where the photovoltaic supervisor system may be installed outside in an area receiving sun exposure that can significantly heat the system.

The subject matter described in this specification may be implemented in hardware, software, firmware, or combinations of hardware, software and/or firmware. In some examples, the subject matter described in this specification may be implemented using a non-transitory computer readable medium storing computer executable instructions that when executed by one or more processors of a computer cause the computer to perform operations.

Computer readable media suitable for implementing the subject matter described in this specification include non-transitory computer-readable media, such as disk memory devices, chip memory devices, programmable logic devices, random access memory (RAM), read only memory (ROM), optical read/write memory, cache memory, magnetic read/write memory, flash memory, and application specific integrated circuits. In addition, a computer readable medium that implements the subject matter described in this specification may be located on a single device or computing platform or may be distributed across multiple devices or computing platforms.

DETAILED DESCRIPTION

Figure 1:
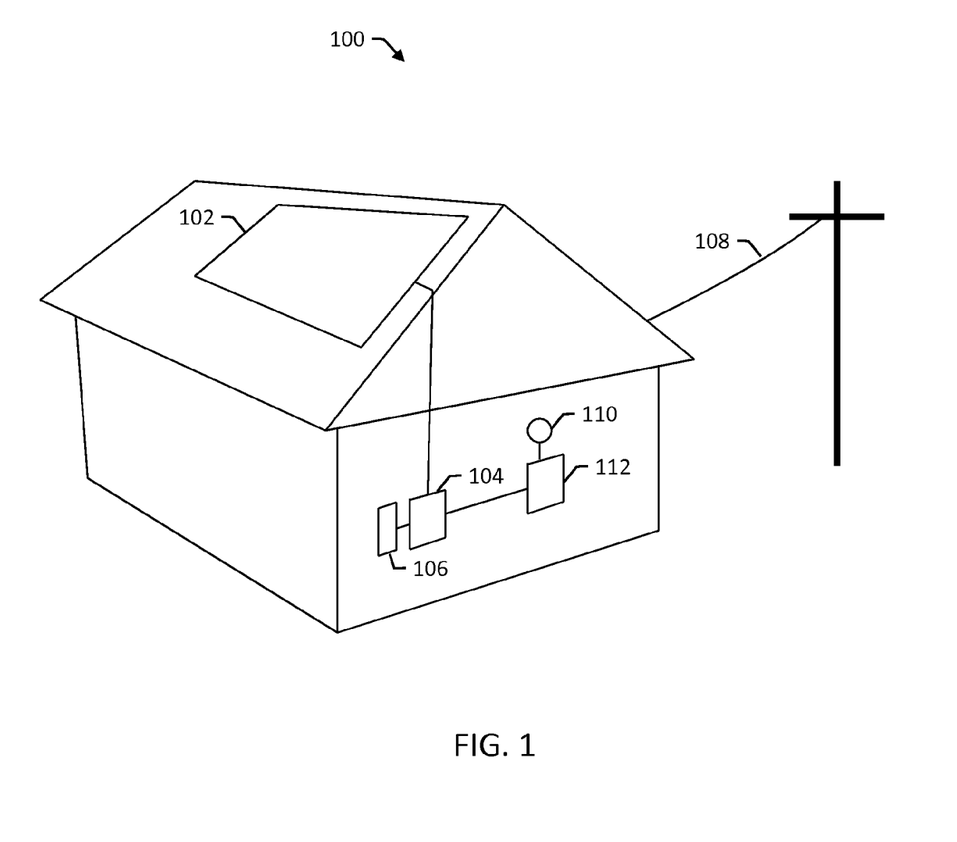
FIG. 1 is a diagram of an example electric system.

FIG. 1 is a diagram of an example electric system 100. The electric system 100 includes a solar panel system 102 including one or more photovoltaic solar panels, one or more inverters 104 coupled to the solar panel system 102, and a photovoltaic supervisor system 106. The electric system 100 also includes a connection 108 to a utility grid, an electric meter 110 for the connection 108 to the utility grid, and an electric panel 112 for the electric system 100.

When the sun is shining on the solar panel system 102, the solar panel system 102 produces direct current (DC) electric power and provides the DC power to the inverters 104. In response, the inverters 104 produce alternating current (AC) power for consumption by loads on the electric system 100 or for providing to the connection 108 to the utility grid. When the loads on the electric system 100 consume more power than is provided by the solar panel system 102, the loads draw power from the connection 108 to the utility grid. When loads consume less power than is provided by the solar panel system 102, the solar panel system 102 can provide the excess power to the connection 108 to the utility grid. Although FIG. 1 illustrates a grid-tied electric system 100, the systems and methods described in this specification can be applied in various other types of electric systems.

The photovoltaic supervisor system 106 is a computing system configured, by virtue of appropriate programming, to monitor the solar panel system 102 and perform one or more actions based on monitoring the solar panel system 102. For example, the photovoltaic supervisor system 106 can be configured for interfacing with net and sub meters, inverters, and other optional components of the system. In some examples, the photovoltaic supervisor system 106 measures power output by the solar panel system 102 and transmits measurements to a remote system, e.g., a homeowner's computer system or a building manager's computer system.

In some examples, the solar panel system 102 is installed on a south-facing roof, where the power output of the solar panel system 102 will be maximized for a particular building. Then, the photovoltaic supervisor system 106 may be installed on a south-facing wall below the solar panel system 102, or in another area receiving direct sun exposure. The direct sun exposure and heat dissipation of electric components within the photovoltaic supervisor system 106 can cause the ambient temperature in photovoltaic supervisor system 106 to rise significantly. In some cases, the temperature inside the photovoltaic supervisor system 106 may exceed a temperature rating for one or more electric components within the photovoltaic supervisor system 106 if the photovoltaic supervisor system 106 is not appropriately cooled.

Moreover, the photovoltaic supervisor system 106 can be housed in a weatherproof enclosure and can be designed to be small to reduce wall space and improve aesthetics. The small size and the weatherproof enclosure can place further thermal stress on the electric components of the photovoltaic supervisor system 106. In some examples, the photovoltaic supervisor system 106 includes consumer grade technology, e.g., cellular and WiFi radio technology designed and/or rated for use in narrow temperature ranges, which can reduce the cost of the system but typically does not support a long life span at high temperatures.

To mitigate the effects of high temperatures in the photovoltaic supervisor system 106, the photovoltaic supervisor system 106 includes a thermal management circuit. The thermal management circuit is configured for curtailing power consumption of one or more electric components based on monitoring temperature sensors. The thermal management circuit is described further below with reference to FIGS. 2-5.

Figure 2:
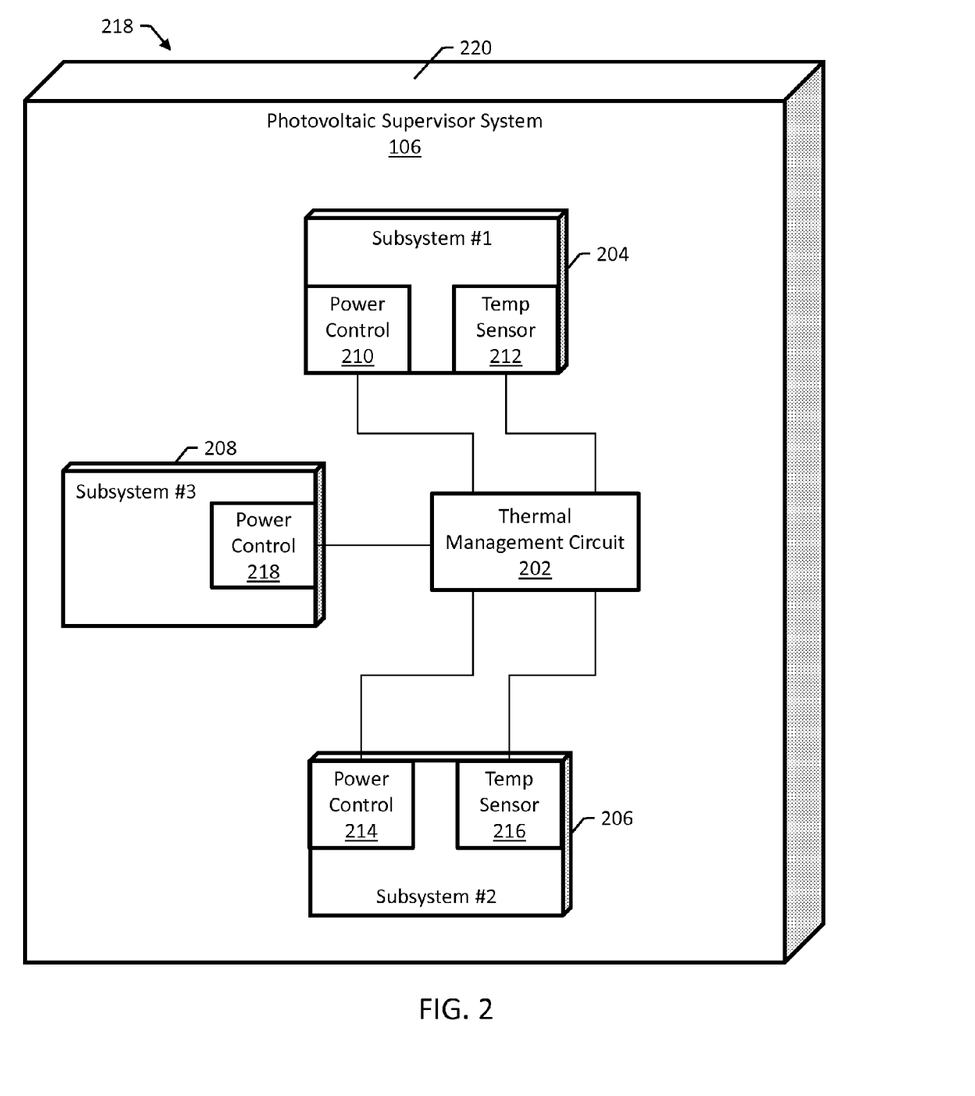
FIG. 2 is an example layout of subsystems of electric components within an example photovoltaic supervisor system.

FIG. 2 is an example layout of subsystems of electric components within an example photovoltaic supervisor system 106. The photovoltaic supervisor system 106 includes three subsystems 204, 206, and 208 of electric components. The subsystems 204, 206, and 208 can be enclosed within a weatherproof housing 218. The housing 218 is depicted as being rectangular, but in general, the housing 218 can be any appropriate shape.

Each subsystem includes one or more electric components. For example, the first subsystem 204 can be a first component of a data transmission system, the second subsystem 206 can be a second component of a data transmission system, and the third subsystem 208 can be a measurement circuit. The electric components can be any appropriate type of electric component that draws electric power and dissipates some heat during operation. For example, one or more of the electric components can be active components, e.g., diodes, transistors, integrated circuits, or processors, and one or more of the electric components can be passive components, e.g., resistors, transducers, or antennas.

In the example layout of FIG. 2, the first subsystem 204 includes a power control circuit 210 and a temperature sensor 212. The second subsystem 206 also includes a power control circuit 214 and a temperature sensor 216. The third subsystem 208 includes a power control circuit 218. In other examples, the photovoltaic supervisor system 106 can include other combinations of one or more electric components and one or more temperature sensors. The temperature sensors 212 and 216 can be any appropriate type of temperature sensor, e.g., thermistor temperature sensors or silicon bandgap temperature sensors.

The temperature sensors 212 and 216 can be physically located on or in the housing 218 based on a heat map of the photovoltaic supervisor system 106. The heat map can be based on, e.g., a computer simulation of the operation of the photovoltaic supervisor system 106, or measured data from temperature sensors during test operation of the photovoltaic supervisor system 106. In some examples, the temperature sensors are located in the hottest areas of the housing 218.

For example, in some cases, the hottest area of the housing 218 will be the top 220 of the housing, i.e., the area of the housing designed to be oriented towards a roof, because hot air within the housing will rise to the top 220. In those cases, one or more temperature sensors can be located near the top 220 of the housing 218. In the example layout of FIG. 2, the temperature sensor 212 of the first subsystem 204 is near the top 220 of the housing 218.

In some examples, the photovoltaic supervisor system 106 will include wireless data transmitters. For example, the first and second subsystems 204 and 206 can be transmitters of a wireless data communication system. Wireless data transmitters can dissipate a significant amount of heat due to the need to energize an antenna sufficiently for a signal to reach a remote system. In those examples, the temperature sensors can be located near the wireless data transmitters. For example, as illustrated in FIG. 2, the first and second subsystems 204 and 206 include temperature sensors 212 and 216.

The thermal management circuit 202 is configured to curtail power consumption of the subsystems 204, 206, and 208 based on monitoring the temperature sensors 212 and 216. The thermal management circuit 202 can be implemented in hardware, software, firmware, or combinations of hardware, software and/or firmware. For example, the thermal management circuit 202 can be a general purpose processor for the photovoltaic supervisor system 106 that is configured to act as a special purpose computer for the purpose of thermal management by virtue of software or firmware for thermal management.

In operation, the thermal management circuit 202 monitors the temperature sensors 212 and 216. For example, the thermal management circuit 202 can receive electric signals from the temperature sensors 212 and 216 that indicate measured temperatures using voltage. Based on the measured temperatures, the thermal management circuit 202 can take one or more actions.

In some examples, the thermal management circuit 202 can compare the measured temperatures to threshold temperatures and take actions when one or more of the measured temperatures exceeds a threshold. In some examples, the thermal management circuit can compare the measured temperatures to one or more temperature profiles which can indicate high heat conditions within the photovoltaic supervisor system 106.

In response to monitoring the temperature sensors 212 and 216, the thermal management circuit 202 can curtail power consumption using the power control circuits 210, 214, and 218, which can reduce heat dissipation in the photovoltaic supervisor system 106. In some examples, one or more of the power control circuits 210, 214, and 218 are digital circuits, and the thermal management circuit 202 can send digital commands to curtail power consumption. In some examples, one or more of the power control circuits 210, 214, and 218 are analog circuits, and the thermal management circuit 202 can curtail power consumption using direct control signals, e.g., pulse width modulated signals.

The thermal management circuit 202 can curtail power consumption by taking any of one or more appropriate power curtailment actions. For example, the thermal management circuit 202 can cause one or more subsystems to power down completely, so that it is no longer operating. In some examples, the thermal management circuit 202 can cause one or more subsystems to curtail power consumption by causing the subsystems to run more slowly or with reduced functionality compared to the maximum speed and functionality of the subsystems. Additional examples of power curtailment are described further below with reference to FIG. 3.

Figure 3:
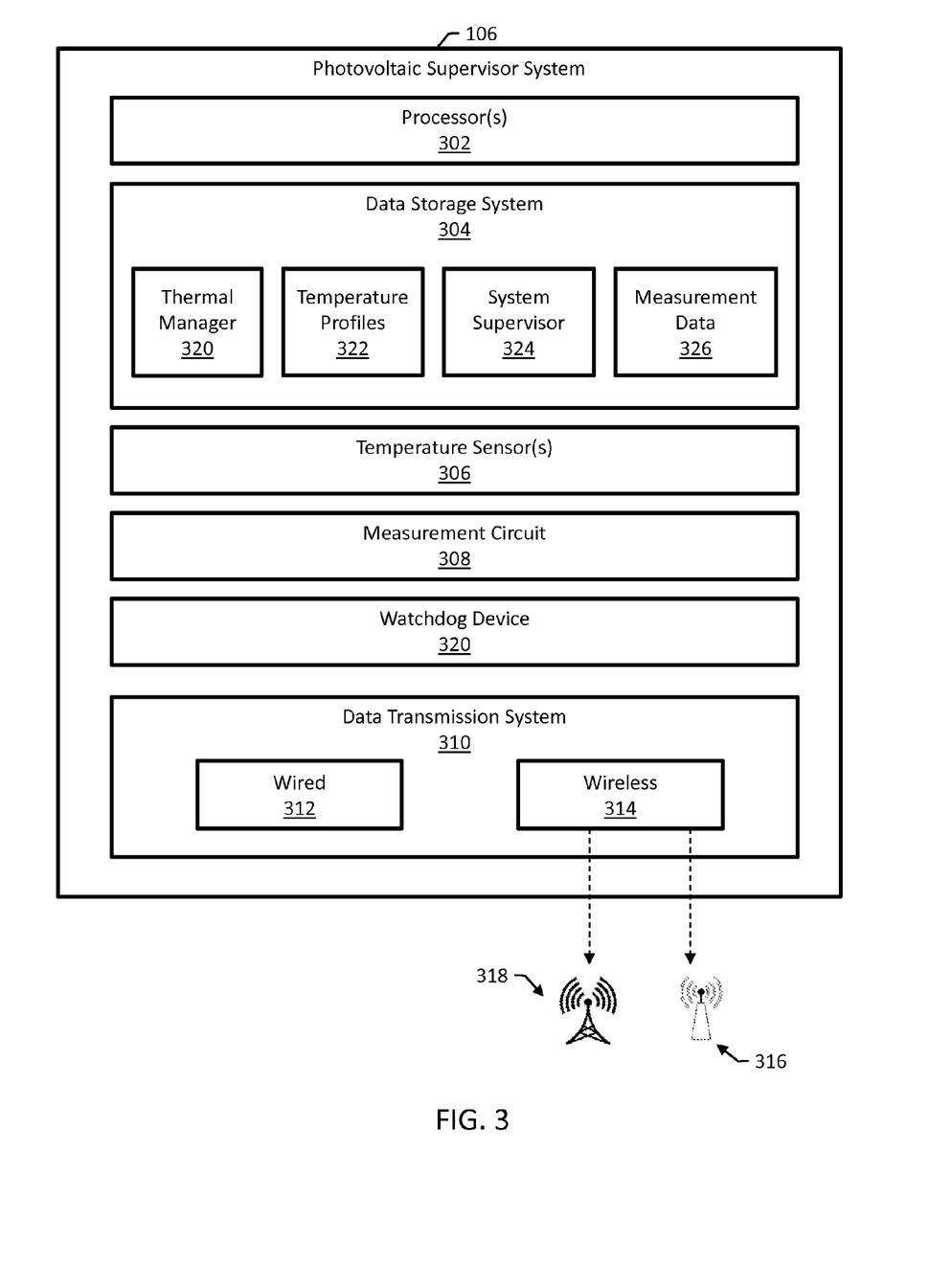
FIG. 3 is a block diagram of an example photovoltaic supervisor system.

FIG. 3 is a block diagram of an example photovoltaic supervisor system 106. The photovoltaic supervisor system 106 includes one or more processors 302, a data storage system 304, one or more temperature sensors 306, a measurement circuit 308, a data transmission system 310, and a watchdog device 320. The photovoltaic supervisor system 106 can include other optional components as appropriate for a particular electric system.

The data storage system 304 stores executable instructions for the processors 302 and other data. The executable instructions include a thermal manager 320 and a system supervisor 324. The other data can include one or more temperature profiles 322 used by the thermal manager 320 and measurement data received from the measurement circuit 308. In some examples, the data storage system 304 includes one or more computer readable media, and the processors 302 load instructions from the data storage system 304 into random access memory for execution.

The data transmission system 310 can include a wired transmission device 312 and a wireless transmission device 314. The wired transmission device 312 can be, e.g., a power line communications device. The wireless transmission device 314 can include one or more antennas distributed throughout the photovoltaic supervisor system 106 in a spaced-apart arrangement to reduce or minimize interference between the antennas.

In some examples, the wireless transmission device 314 is configured to communicate over multiple communication channels. For example, the wireless transmission device 314 can communicate with a WiFi access point 316 to communicate over a local area network (LAN). The wireless transmission device 316 can alternatively, or in addition, communicate with a cellular tower 318 using a cellular modem. The temperature sensors 306 can be located near the wireless transmission device 314 since the transmitters of the wireless transmission device 314 may dissipate a significant amount of heat relative to other components of the system.

The measurement circuit 308 is configured to measure power output from a solar panel system, e.g., the solar panel system 102 of FIG. 1. For example, the measurement circuit 308 can include a voltage sensor and a current sensor. The measurement circuit 308 can include a surge and transient protection circuit and a safety isolation circuit.

In operation, the system supervisor 324 causes the photovoltaic supervisor system 106 to take measurements of the power output from the solar panel system using the measurement circuit 308 and to transmit some or all of those measurements to one or more remote systems using the data transmission system 310. For example, the data transmission system 310 can transmit the measurements to a remote computer system of a manufacturer or installer of a solar panel system, e.g., using a cellular network and the Internet. The data transmission system 310 can transmit the measurements to a remote computer system of a homeowner or building manager, e.g., using a local area network (LAN). The transmitted measurements can be used for monitoring the solar panel system.

The thermal manager 320 monitors the temperature sensors 306 and, based on monitoring the temperature sensors 306, causes one or more components of the photovoltaic supervisor system 106 to curtail power consumption, which can reduce heat dissipation within the photovoltaic supervisor system 106. The thermal manager 320 can determine when to curtail power consumption using one or more temperature profiles 322.

A temperature profile can specify, e.g., one or more threshold temperatures for each temperature sensor. When a measured temperature exceeds a respective threshold temperature, the thermal manager 320 can take an action specified by the temperature profile for that threshold. In some examples, a temperature profile can specify a combination of thresholds, e.g., to take an action only if one measured temperature and another measured temperature both exceed respective thresholds.

The thermal manager 320 can curtail power consumption using one or more of various curtailment commands or control signals. For example, the thermal manager 320 can cause the data transmission system to switch from transmitting at a first data throughput rate to transmitting at a second data throughput rate lower than the first data throughput rate, e.g., by sending data once every 15 minutes instead of once every 5 minutes. The data storage system 304 can store measured data that is not transmitted as the measurement data 326, and the stored measurement data 324 can be transmitted later when the measured temperatures drop.

In another example, the thermal manager 320 can cause the data transmission system 310 to switch from transmitting to both the cellular tower 318 and the WiFi access point 316 to transmitting to only one of those receivers. The thermal manager 320 can, if the wired transmitter 312 is connected, switch from transmitting on the wireless transmitter 314 to the wired transmitter 312. If one or more of the measured temperatures continue to rise even after curtailing power, the thermal manager 320 can power down the data transmission system 310 entirely and go into a record only mode, where the data storage system 304 stores all of the measured data from the measurement circuit 308 for later transmission when one or more measured temperatures drop.

If one or more of the measured temperatures continue to rise after powering down the data transmission system 310, e.g., to a critical range specified in a temperature profile, then the thermal manager 320 can power down the entire photovoltaic supervisor system 106, leaving only the watchdog device 320 running. The watchdog device 320 is an electric circuit implemented in hardware, software, firmware, or a combination. The watchdog device 320 is configured to wake up the measurement circuit 308 and the data storage system 204 on a periodic basis to take some measurements and then power down the measurement circuit 308 and the data storage system 304. In some examples, the thermal manager 320 and/or the system supervisor 324 can reduce the amount of data collected using the measurement circuit 308.

Figure 4:
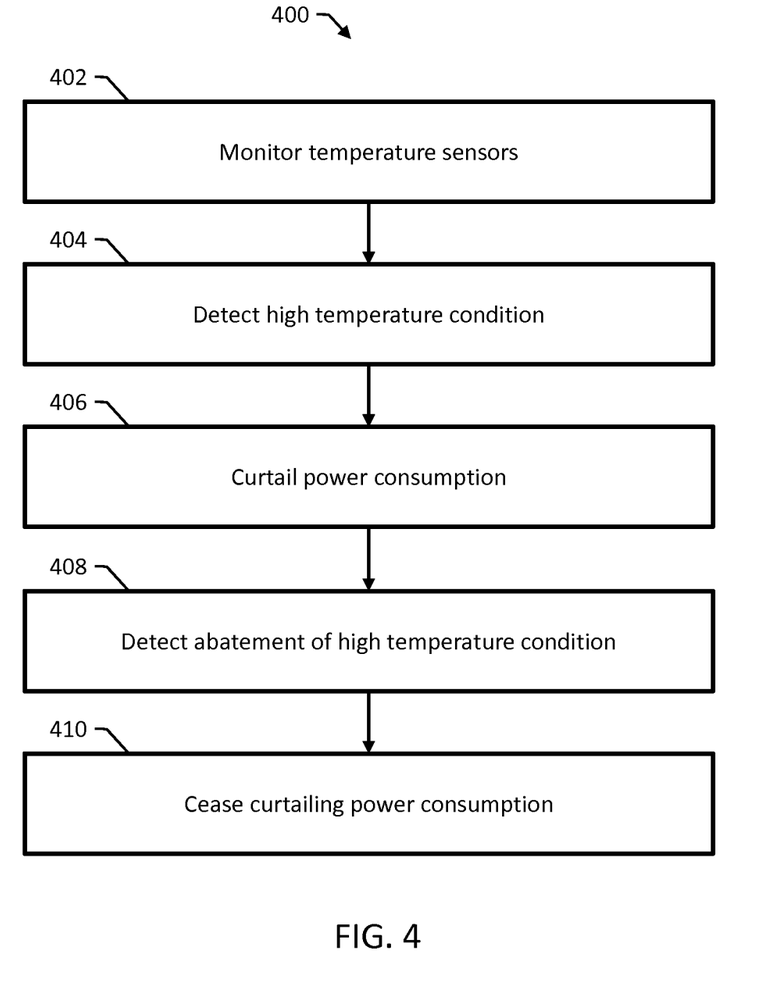
FIG. 4 is a flow diagram of an example method for thermal management of a system of one or more electric components.

FIG. 4 is a flow diagram of an example method 400 for thermal management of a system of one or more electric components. A thermal management circuit can perform the method 400.

The thermal management circuit monitors one or more temperatures sensors in or on a housing for one or more electric components (402). For example, the thermal management can monitor a voltage across the temperature sensors that is proportional to the ambient air temperature around the temperature sensors.

The thermal management circuit detects a high temperature condition in the system by determining that measurement data from the temperature sensors matches a temperature profile for a high temperature condition (404). For example, the thermal management circuit can determine that a measured temperature from at least a first temperature sensor exceeds a threshold. In some examples, the thermal management circuit can detect a condition related to one or more temperature measurements. The condition can be that a measured temperature or the rate of change of the temperature exceeds a threshold or another function of how the temperature changes over time matches a signature specified by the temperature profile. This can be useful, e.g., where it is not feasible to place a temperature sensor very close to the hottest part of an electric component. In some cases, the sensor will measure a lower temperature than the electric component, and the temperature difference may not be constant.

In response to determining that the measurement data matches the temperature profile, the thermal management circuit causes at least a first electric component to curtail power consumption, thereby reducing heat dissipation by the first electric component (406). For example, the thermal management circuit can cause the first electric component to shut down, to cease performing one or more functions, and/or to switch from operating at a first frequency to operating at a second frequency lower than the first frequency.

The thermal management circuit continues to monitor the temperature sensors and, later, detects that the high temperature condition has abated (408). For example, the thermal management circuit can determine that a measured temperature from the first temperature sensor has dropped below the threshold that triggered curtailment. In response to determining that the high temperature condition has abated, the thermal management circuit causes the first electric component to cease curtailing power consumption (410).

Figure 5:
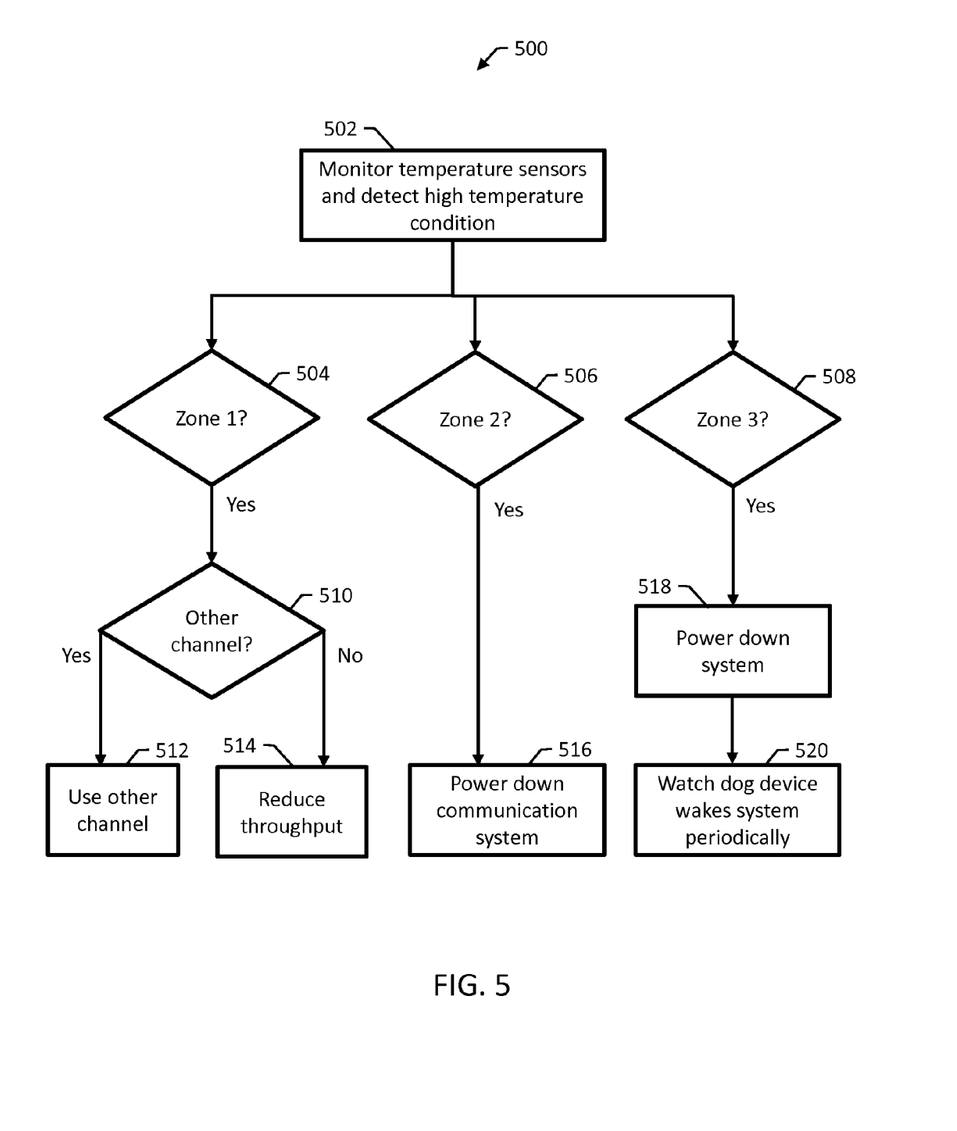
FIG. 5 is a flow diagram of an example method for thermal management of a photovoltaic supervisor system.

FIG. 5 is a flow diagram of an example method 500 for thermal management of a photovoltaic supervisor system 106. A thermal management circuit can perform the method 500. The method 500 illustrates an example series of operations for an example photovoltaic supervisor system having three temperature sensors covering three physical zones of the system.

The thermal management circuit monitors the temperature sensors and detects a high temperature condition (502). The thermal management circuit determines whether the first, second, and/or third temperature sensors are indicating temperatures exceeding one or more threshold temperatures (504, 506, 508). If the measured temperature from the first temperature sensor exceeds a threshold, then the thermal management circuit determines whether a communications system in the first zone can communicate on a different channel that will result in power curtailment (510).

If so, the thermal management circuit causes the communications system to switch to the different channel (512). If not, the thermal management circuit causes the communications system to reduce its throughput (514). For example, the thermal management circuit can send a digital command to the communications system over a system bus.

If the measured temperature from the second temperature sensor exceeds a threshold, then the thermal management circuit powers down the communications system (516). The thermal management circuit can cause the photovoltaic supervisor system to store measurement data that would have been transmitted during normal operation. If the measured temperature from the first temperature sensor exceeds a threshold, then the thermal management circuit powers down the entire photovoltaic system (518). The thermal management circuit can activate a watch dog device that periodically wakes the system to store measurement data for later transmission when the high temperature condition abates.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic supervisor system comprising:
a housing;
one or more temperature sensors on or in the housing;
a measurement circuit and a wireless data transmission system configured to transmit measured data from the measurement circuit; and
a thermal management circuit coupled to the wireless data transmission system and the temperature sensors, wherein the thermal management circuit is configured to monitor the temperature sensors and, based on monitoring the temperature sensors, cause the wireless data transmission system to curtail power consumption, thereby reducing heat dissipation by the wireless data transmission system, by causing the wireless data transmission system to switch from transmitting at a first data throughput rate to transmitting at a second data throughput rate lower than the first data throughput rate.

2. The system of claim 1, wherein the thermal management circuit is configured to cause the first electric component to curtail power consumption in response to determining that a measured temperature from at least a first temperature sensor exceeds a threshold.

3. The system of claim 1, wherein the thermal management circuit is configured to cause the first electric component to cease curtailing power consumption in response to determining that a measured temperature from at least a first temperature sensor has dropped below a threshold.

4. The system of claim 1, wherein the thermal management circuit is configured to cause the first electric component to curtail power consumption by one or more of: causing the first electric component to shut down, causing the first electric component to cease performing one or more functions, and causing the first electric component to switch from operating at a first frequency to operating at a second frequency lower than the first frequency.

5. The system of claim 1, comprising a data storage system, wherein the thermal management circuit is configured to cause the data storage system to store at least some of the measured data from the measurement circuit while the wireless data transmission system is transmitting at the second data throughput rate.

6. The system of claim 5, wherein the thermal management circuit is configured to cause the wireless data transmission system to transmit the measured data stored on the data storage system in response to determining that a measured temperature from at least a first temperature sensor has dropped below a threshold.

7. The system of claim 1, comprising a watch dog processor, wherein the thermal management circuit is configured to power down the measurement circuit and the wireless data transmission system in response to determining that a measured temperature from at least a first temperature sensor exceeds a threshold, and wherein the watch dog processor is configured to periodically wake the measurement circuit and cause the data storage system to store at least some of the measured data from the measurement circuit.

8. The system of claim 1, wherein the housing comprises a weatherproof shell enclosing the one or more electric components, and wherein the system comprises a measurement input for coupling to the measurement circuit and to a solar panel system, and wherein the measurement circuit is configured to measure power production of the solar panel system.

9. A method comprising:
monitoring, by a thermal management circuit, one or more temperature sensors in or on a housing for one or more electric components;
determining, by the thermal management circuit, that measurement data from the temperature sensors matches a temperature profile for a high temperature condition; and
in response to determining that the measurement data matches the temperature profile, causing, by the thermal management circuit, at least a first electric component to curtail power consumption, thereby reducing heat dissipation by the first electric component;
wherein the first electric component comprises a wireless data transmission system, and wherein causing the first electric component to curtail power consumption comprises causing the wireless data transmission system to switch from transmitting at a first data throughput rate to transmitting at a second data throughput rate lower than the first data throughput rate.

10. The method of claim 9, wherein determining that the measurement data from the temperature sensors matches the temperature profile comprises determining that a measured temperature from at least a first temperature sensor exceeds a threshold.

11. The method of claim 9, comprising causing the first electric component to cease curtailing power consumption in response to determining that a measured temperature from at least a first temperature sensor has dropped below a threshold.

12. The method of claim 9, wherein causing the first electric component to curtail power consumption comprises one or more of: causing the first electric component to shut down, causing the first electric component to cease performing one or more functions, and causing the first electric component to switch from operating at a first frequency to operating at a second frequency lower than the first frequency.

13. The method of claim 9, comprising storing, in a data storage system, at least some of the measured data from the measurement circuit while the wireless data transmission system is transmitting at the second data throughput rate.

14. The method of claim 13, comprising causing the wireless data transmission system to transmit the measured data stored on the data storage system in response to determining that a measured temperature from at least a first temperature sensor has dropped below a threshold.

15. The method of claim 9, comprising powering down the measurement circuit and the wireless data transmission system in response to determining that a measured temperature from at least a first temperature sensor exceeds a threshold and periodically waking the measurement circuit and storing, on the data storage system, at least some of the measured data from the measurement circuit.

16. A photovoltaic supervisor system comprising:
a housing;
one or more temperature sensors on or in the housing;
a wireless data transmission system configured to transmit data on first and second communication channels; and
a thermal management circuit coupled to the wireless data transmission system and the temperature sensors, wherein the thermal management circuit is configured to monitor the temperature sensors and, based on monitoring the temperature sensors, cause the wireless data transmission system to curtail power consumption, thereby reducing heat dissipation by the wireless data transmission system; and
wherein the thermal management circuit is configured to cause the wireless data transmission system to curtail power by switching from transmitting on the first communication channel to transmitting on the second communication channel.

17. A method comprising:
monitoring, by a thermal management circuit, one or more temperature sensors in or on a housing for one or more electric components;
determining, by the thermal management circuit, that measurement data from the temperature sensors matches a temperature profile for a high temperature condition; and
in response to determining that the measurement data matches the temperature profile, causing, by the thermal management circuit, at least a first electric component to curtail power consumption, thereby reducing heat dissipation by the first electric component;
wherein the first electric component comprises a wireless data transmission system configured to transmit data on first and second communication channels, and wherein causing the first electric component to curtail power consumption comprises causing the wireless data transmission system to curtail power by switching from transmitting on the first communication channel to transmitting on the second communication channel.

18. A system comprising:
a solar panel system comprising one or more photovoltaic solar panels; and
a photovoltaic supervisor system for the solar panel system, the photovoltaic supervisor system comprising:
a housing;
a measurement circuit coupled to the solar panel system;
a wireless data transmission system configured to transmit measurement data from the measurement circuit;
one or more temperature sensors on or in the housing; and
a thermal management circuit coupled to the wireless data transmission system and the temperature sensors, wherein the thermal management circuit is configured to monitor the temperature sensors and, based on monitoring the temperature sensors, cause the wireless data transmission system to curtail power consumption, thereby reducing heat dissipation by the wireless data transmission system.

* * * * *